United States Patent
Yamamoto et al.

(10) Patent No.: US 7,224,611 B2
(45) Date of Patent: May 29, 2007

(54) VIRTUAL GROUND LINE TYPE MEMORY DEVICE WITH HIGH SPEED READOUT CIRCUIT

(75) Inventors: Kaoru Yamamoto, Yamato Kohriyama (JP); Nobuhiko Ito, Tenri (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/173,925

(22) Filed: Jul. 1, 2005

(65) Prior Publication Data

US 2006/0002175 A1 Jan. 5, 2006

(30) Foreign Application Priority Data

Jul. 2, 2004 (JP) ............... 2004-197007

(51) Int. Cl.
*G11C 11/34* (2006.01)
(52) U.S. Cl. ............... 365/185.21; 365/185.16; 365/185.18; 365/185.25
(58) Field of Classification Search ....... 365/185.21 O, 365/185.16 X, 185.18 X, 185.25 X, 185.21, 365/185.16, 185.18, 185.25
See application file for complete search history.

(56) References Cited

U.S. PATENT DOCUMENTS 5,027,321 A 6/1991 Park
6,744,667 B2 * 6/2004 Yamamoto et al. ..... 365/185.16
6,744,674 B1 6/2004 Le et al.
6,816,423 B2 * 11/2004 Yamada .................. 365/203
2003/0202411 A1 10/2003 Yamada

FOREIGN PATENT DOCUMENTS

JP 3-176895 A 7/1991
JP 2003-323796 A 11/2003

OTHER PUBLICATIONS

European Search Report completed Mar. 9, 2006 for European Patent Application No. 05254075, two pages.

* cited by examiner

*Primary Examiner*—VanThu Nguyen
(74) *Attorney, Agent, or Firm*—Morrison & Foerster LLP

(57) ABSTRACT

A semiconductor memory device having a virtual ground line type memory array structure includes a readout circuit for selecting a pair of selected bit lines connected to the source and the drain of a memory cell to be read, applying a predetermined voltage to between the paired selected bit lines, and sensing a memory cell current flowing through the memory cell to be read, and a counter potential generation circuit for generating from an intermediate node potential, which is higher than any level of the potential on the selected bit lines and supplied from an intermediate node on a current path for feeding the memory cell current in the readout circuit, a counter potential which varies in the same direction as of the intermediate node potential depending on the memory cell current so that its variation is greater than that of the intermediate node potential, wherein the counter potential is applied to an unselected bit line allocated next to one at a high level of the paired selected bit lines.

14 Claims, 10 Drawing Sheets

VIRTUAL GROUND LINE TYPE MEMORY DEVICE WITH HIGH SPEED READOUT CIRCUIT

CROSS REFERENCE TO RELATED APPLICATION

This Nonprovisional application claims priority under 35 U.S.C. §119(a) on Patent Application No. 2004-197007 filed in Japan on Jul. 2, 2004, the entire contents of which are hereby incorporated by reference.

BACKGROUND OF THE INVENTION

1. Field of the Invention

The invention relates to a semiconductor memory device and, more particularly, to a readout circuit for a semiconductor memory device arranged of a virtual ground line type memory cell array.

2. Description of the Related Art

As the function of mobile telephones is improved or the application of memory cards and files is increased, flash memories have been scaled up in the memory size. For the purpose, particularly cost down, a variety of devices have been developed where the effective cell area is minimized, using a multilevel storage technique for storing multilevel data, not less than three levels, in each memory cell or a memory cell array technique of virtual ground line type where the drain and source of each transistor are arranged common to any two adjacent memory cells along a row.

Particularly, such a virtual ground line type memory cell array technique allows the cell area to be decreased by the scheme of circuitry arrangements and hence has an advantage of producing a smaller chip-area device with the use of a known process. However, as its virtual ground line construction permits leak currents from the adjacent memory cell during the readout action to be hardly negligible, the memory cell array has to be modified for increasing the speed of the readout action.

One of the conventional virtual ground line type memory cell array techniques is disclosed in JP-A 3-176895 (1991) where the drawback of leak current is overcome.

FIG. 9 illustrates a virtual ground line type memory cell array of EPROM according to the technique disclosed in JP-A 3-176895 (1991). Each memory cell MC in the memory cell array is a known electrically programmable insulating gate n-channel field effect transistor. The memory cell MC is connected at the control gate to a row line WL, at the source to a source column line SL, and at the drain to a drain column line DL. Both the source column line SL and the drain column line DL are buried bit lines in the diffusion area.

For selecting and reading a memory cell MCb, for example, its corresponding row line WLa is selectively activated by shifting to a positive high potential and, simultaneously, the source column line SLb is grounded via a MOSFET 34. The other lines at the right of the memory cell MCb including the drain column line DLb remain at the floating state. Also, its corresponding drain column line DLa is applied with a readout drain bias potential DRB from a node 33 via another MOSFET 32. The adjacent source column line SLa is applied with a drain bias voltage RDP from a node 31 via a transistor 30. The other source lines at the left of the source column line SLa all remain at the floating state.

The readout drain bias potential RDP applied to the node 31 is equal to the potential DRB applied to the node 33, for example, 1.2 V. As the two potentials are equal, the readout current is fully received by the memory cell MCb to be read, but not transferred to the adjacent memory cell MCa. Accordingly, leakage of the current to any adjacent memory cell can be prevented while the high-speed access is achieved.

Alternatively, another conventional virtual ground line type memory cell array is disclosed in JP-A 2003-323796 where the precharge level on the bit lines can be controlled.

FIG. 10 illustrates a circuitry arrangement where a current mirror circuit, disclosed in JP-A 2003-323796, for generating a precharge is used in a virtual ground line type memory cell array of a floating gate structure of, e.g., a flash memory. The current mirror circuit shown in FIG. 10 feeds a bit line L3 with a precharge via a signal line DATAP. The current mirror circuit causes the potential on the signal line DATAP (for a data P signal) to be equal to the potential at the signal line DATA (for a data signal). Accordingly, as the two signal lines DATA and DATAP are controlled to remain equal in the potential, the flow of charge current from the bit line L2 to the bit line L3 is inhibited. Since the precharging period is shortened and the readout current for reading a memory cell A is prevented from discharging to the bit line L3, the high-speed access can be achieved.

Using the foregoing conventional technique, the readout action is carried out where the drain current applied to the drain of a memory cell to be read is declined by the resistance of the bit lines and the effect of a memory cell current through the bit lines. As other memory cells adjacent to the memory cell to be read has its leak current much smaller than the memory cell current on the memory cell to be read, their drain potential (appropriately referred to as "counter potential" hereinafter) will be declined to a minimum. Accordingly, there will be occurred a difference of the potential between the drain of the memory cell to be read and the drain of each adjacent memory cell in the memory cell array regardless of controlling the potential on the selected bit line to a level equal to the potential on the unselected bit line, hence permitting the generation of leak current. The flow of leak current will thus decline the memory cell current through the selected bit line. As the memory cell current is declined, its measurement by a sense amplifier will drop down hence lowering the marginal factor in the readout action.

More particularly, when the adjacent memory cell MCa shown in FIG. 9 is not high in the threshold voltage, the potential of the memory cell MCb to be read is attenuated at the drain by the readout current and will thus produce a difference between the drain and the source of the adjacent memory cell MCa. As a result, the drain potential RDB on the adjacent memory cell will generate a leak current.

SUMMARY OF THE INVENTION

The invention has been accomplished in view of the above drawbacks and its object is to provide a semiconductor memory cell which has a virtual ground line type memory cell array arranged in which the leak current from a memory cell connected adjacent to the memory cell to be read can be inhibited thus achieving the high-speed readout action.

For achievement of the foregoing object of the invention, a semiconductor memory device is provided comprising: a memory cell array having a plurality of memory cells arranged in a matrix form of rows and columns, each memory cell having a first electrode and a pair of second electrodes arranged from which memory data can be read out by the first electrode conducting with its potential between the two second electrodes, each row of the memory cells connected at their first electrode with a common word line, any two adjacent memory cells connected at one of the two second electrodes to each other along the row, each column of the memory cells connected at one of their two second electrodes with a common first bit line and at the other with a common second bit line, the first bit lines and the second bit lines arranged alternately; a readout circuit for selecting a pair of the first and second bit lines both connected to the memory cell to be read, applying a predetermined voltage to between the two, first and second, selected bit lines, and sensing a memory cell current flowing through the memory cell to be read in order to conduct a readout action; and a counter potential generation circuit for, in the readout action, generating from an intermediate node potential, which is higher than any level of the potential on the two, first and second, selected bit lines and supplied from an intermediate node on a current path for feeding the memory cell current in the readout circuit, a counter potential which varies in the same direction as of the intermediate node potential depending on the memory cell current so that its variation is greater than that of the intermediate node potential, wherein the counter potential is applied, when the readout action, to the first bit line or the second bit line allocated next to one at a high level of the two, first and second, selected bit lines or to the first bit line or the second bit line separated from one at a high level of the two, first and second, selected bit lines by the first bit line or the second bit line or both the bit lines, at least one of which is held at the floating state. In particular, it is designated as a first feature of the invention that, when the readout action, the counter potential is applied to the first bit line or the second bit line allocated next to one at a high level of the two, first and second, selected bit lines. It is also designated as a second feature of the invention that the counter potential is applied to one of the two, first and second, bit lines which are separated from one at a high level of the two, first and second, selected bit lines by the first bit line or the second bit line or both the bit lines, at least one of which is held at the floating state.

According to the first feature of the invention, the change in the intermediate node potential which varies with the condition of conduction on the memory cell to be read or the memory cell current is smaller than the change in the bit line potential which is varied by a voltage drop down due to the bit line resistance and applied to the second electrode of the memory cell to be read, whereby the change in the counter potential can be approximated to a change in the bit line potential through favorably determining the amplifying rate of the change in the counter potential to the change in the intermediate node potential in the counter potential generation circuit. Moreover, as the leak current runs along the bit line to which the counter potential is applied is as small as negligible, the bit line potential to be applied to one, at the opposite side of the memory cell to be read, of the two second electrodes of a unselected memory cell allocated next to one at a high level of the two second electrodes of the memory cell to be read will substantially be equal to the counter potential. As a result, the potential on one of the two second electrodes of the unselected memory cell is equal to the bit line potential to be applied to the second electrode of the memory cell to be read while the potential on the other second electrode is equal to the counter potential, wherein a difference between the two potentials will be equal or significantly small. This inhibits the leak current from running between the two second electrodes of the unselected memory cell regardless of the condition of conduction on the memory cell to be read, hence achieving the high-speed reading of data from the memory cell of interest.

According to the second feature of the invention, the change in the intermediate node potential which varies with the condition of conduction on the memory cell to be read or the memory cell current is smaller than the change in the bit line potential which is varied by a voltage drop down due to the bit line resistance and applied to the second electrode of the memory cell to be read, whereby the change in the counter potential can be approximated to a change in the bit line potential through favorably determining the amplifying rate of the change in the counter potential to the change in the intermediate node potential in the counter potential generation circuit. Moreover, as the leak current runs along the bit line to which the counter potential is applied is as small as negligible, the bit line potential to be applied to the second electrodes of unselected memory cells separated from each other by the first bit line or the second bit line or both the bit lines, at least one of which is held at the floating state, will substantially be equal to the counter potential. As a result, the potential on one of the two second electrodes of the unselected memory cell allocated next to one at a high level of the two second electrodes of the memory cell to be read is equal to the bit line potential to be applied to the second electrode of the memory cell to be read while the potential on the other second electrode at the floating state is charged with the bit line potential and the counter potential from the unselected memory cell, wherein a difference between the two potentials will be equal or significantly small. This inhibits the leak current from running between the two second electrodes of the unselected memory cell regardless of the condition of conduction on the memory cell to be read, hence achieving the high-speed reading of data from the memory cell of interest. In addition, the potential for the other one of the two second electrodes of the unselected memory cell allocated next to one at a high level of the two second electrodes of the memory cell to be read can be supplied from the bit line for feeding the counter potential as well as the bit line connected to the memory cell to be read. As a result, the leak current via the adjacent unselected memory cell during the charging action will be reduced. This significantly suppresses the influence of leak currents even when the memory cell current is sensed during the charging action.

The semiconductor memory device according to the invention may be modified as a third feature in addition to the first or second feature in which the counter potential is generated so that its level is higher than the minimum level on one at a high level of the two, first and second, selected bit lines when the intermediate node potential is at a high level or its level is nearly equal to or lower than the minimum level on the selected bit line at the high level when the intermediate node potential is at a low level.

The semiconductor memory device according to the invention may also be modified as a fourth feature in addition to any of the foregoing features in which the counter potential is turned to a level higher than the intermediate node potential when the intermediate node potential is at a high level or to a level lower than the intermediate node potential when the intermediate node potential is at a low level.

According to the third or fourth feature, when the memory cell current across the selected memory cell to be read is large, the potential on the selected bit line at the high level drops down. At the time, the unselected bit line connected not to the memory cell to be read but to the unselected memory cell allocated next to the selected bit line at the high level is applied or enabled to be applied with a counter potential which is lower than the selected bit line potential. Therefore, the leak current from the adjacent unselected memory cell will act to effectively increase the memory cell current, hence improving the margin factor of the readout action. Also, when the memory cell current across the selected memory cell to be read is small, the potential on the selected bit line at the high level will rise up. At the time, the unselected bit line connected not to the memory cell to be read but to the unselected memory cell allocated next to the selected bit line at the high level is applied or enabled to be applied with a counter potential which is higher than the selected bit line potential. Therefore, the leak current from the adjacent unselected memory cell will act to effectively decrease the memory cell current, hence improving the margin factor of the readout action.

The semiconductor memory device according to the invention may be modified as a fifth feature in addition to any of the foregoing features in which when the readout action, the first and second bit lines connected to the memory cells not to be read and not supplied with the counter potential are held at the floating state.

With the unselected bit line to be supplied with the counter potential being connected via an unselected memory cell with any other constant potential than the counter potential, a change in the counter potential with the memory cell current will be limited. The fifth feature successfully avoids the limitation of a change in the counter potential and can thus enhance the effects of the first and second features.

The semiconductor memory device according to the invention may be modified as a sixth feature in addition to any of the foregoing features in which before the readout circuit senses the memory cell current, a predetermined precharge potential is applied to one of two, first and second, unselected bit lines which are connected to the memory cell not to be read, while the other of the two unselected bit lines is supplied with the counter potential.

The semiconductor memory device according to the invention may further be modified as a seventh feature in addition to the second feature in which before the readout circuit senses the memory cell current, a precharge potential is applied to the first bit line or the second bit line or both the bit lines allocated between the two selected bit lines and the second bit line or the first bit line to which the counter potential is applied.

The semiconductor memory device according to the invention may be modified as an eighth feature in addition to the sixth or seventh feature in which the unselected bit line supplied with a precharge potential is turned to the floating state immediately before or after the readout circuit senses the memory cell current.

According to the sixth or eighth feature, the duration of charging with the counter potential the unselected bit line separated by an unselected memory cell from the unselected bit line to which the counter potential is applied is shortened by the effect of the precharge. This suppresses the change in the counter potential during the readout action, thus inhibiting the leak current from the adjacent unselected memory cell and achieving the high-speed reading of data from the memory cell to be read. In particular, the eighth feature allows the unselected bit line to which the counter potential is applied to be not held at the precharge potential from the unselected memory cell thus suppressing the change in the counter potential which varies with the memory cell current and enhancing the effect of the sixth feature.

According to the seventh or eighth feature, the duration of charging with the bit line potential on the selected bit line the unselected bit line to which the counter potential is applied or the unselected bit line allocated next to the selected bit line at the high level via the unselected memory cell from the selected bit line at the high level is shortened by the effect of the precharge. This suppresses the leak current from the unselected memory cell allocated next to the second electrode at the high level of the memory cell to be read, thus achieving the high-speed reading of data from the memory cell to be read. In particular, the eighth feature allows the unselected bit line allocated next to the selected bit line at the high level to be not held at the precharge potential but charged with the bit line potential on the selected bit line or the counter potential, thus enhancing the effect of the seventh feature.

The semiconductor memory device according to the invention may be modified as a ninth feature in addition to any of the sixth to eighth features in which the precharge potential is lower than the counter potential.

According to the ninth feature, the unselected bit line allocated next to the selected bit line at the high level is prevented from being overcharged with the counter potential. This can inhibit the overcharging from producing a leak current running across the unselected memory cell allocated next to the second electrode at the high level of the memory cell to be read.

The semiconductor memory device according to the invention may be modified as a tenth feature in addition to any of the foregoing features in which the counter potential generation circuit is implemented by a single-stage amplifying circuit.

The semiconductor memory device according to the invention may further be modified as an eleventh feature in addition to the tenth feature in which the single-stage amplifying circuit includes a MOSFET connected in a cascade form and set with a predetermined bias potential at the gate.

According to the tenth or eleventh feature, the single-stage amplifying circuit is arranged for receiving the intermediate node potential from the intermediate node on the current path for feeding the memory cell current in order to controllably determine the counter potential. This allows the change in the intermediate node potential to be amplified and used for controllably determining the counter potential, thus controlling the precharge potential on the unselected bit line at high speed and high precision. Particularly according to the eleventh feature, the amplifying circuit is additionally equipped with cascade connected transistors, whereby the amplifying rate can be increased to speed up the action of controllably determining the precharge potential.

The semiconductor memory device according to the invention may be modified as a twelfth feature in addition to any of the foregoing features in which the readout circuit is connected in a cascade form to the upstream side of the intermediate node on the current path and includes a MOSFET of which the gate potential is controllably determined by the intermediate node potential.

According to the twelfth feature, the gate potential of the cascade connected MOSFETs can be controlled so that any change in the potential on the selected bit line at the high level which varies with the memory cell current is compensated. This suppresses the change in the selected bit line potential regardless of the condition of storage in the memory cell to be read, thus inhibiting the leak current from every adjacent unselected memory cell.

The semiconductor memory device according to the invention may be modified as a thirteenth feature in addition to any of the foregoing features in which the memory cell is a nonvolatile memory cell of MOSFET structure for changing the memory status with the threshold voltage, in which the first electrode serves as a control gate of the MOSFET and the paired second electrodes serve as a drain and a source of the MOSFET.

According to the thirteenth feature, while the chip area in a nonvolatile semiconductor memory device, such as a flash memory, having an array of nonvolatile memory cells of MOSFET construction remains minimized with the use of a virtual ground line type memory cell array, the readout action can be free from leak currents which derive from each adjacent memory cell in the memory cell array and may decline the speed and the margin factor of the readout action. As a result, the semiconductor memory device of nonvolatile type can speed up its readout action.

DETAILED DESCRIPTION OF THE INVENTION

Embodiments of a semiconductor memory device according to the invention (appropriately referred to as "inventive device" hereinafter) will be described in more detail referring to the relevant drawings.

FIRST EMBODIMENT

Figure 1:
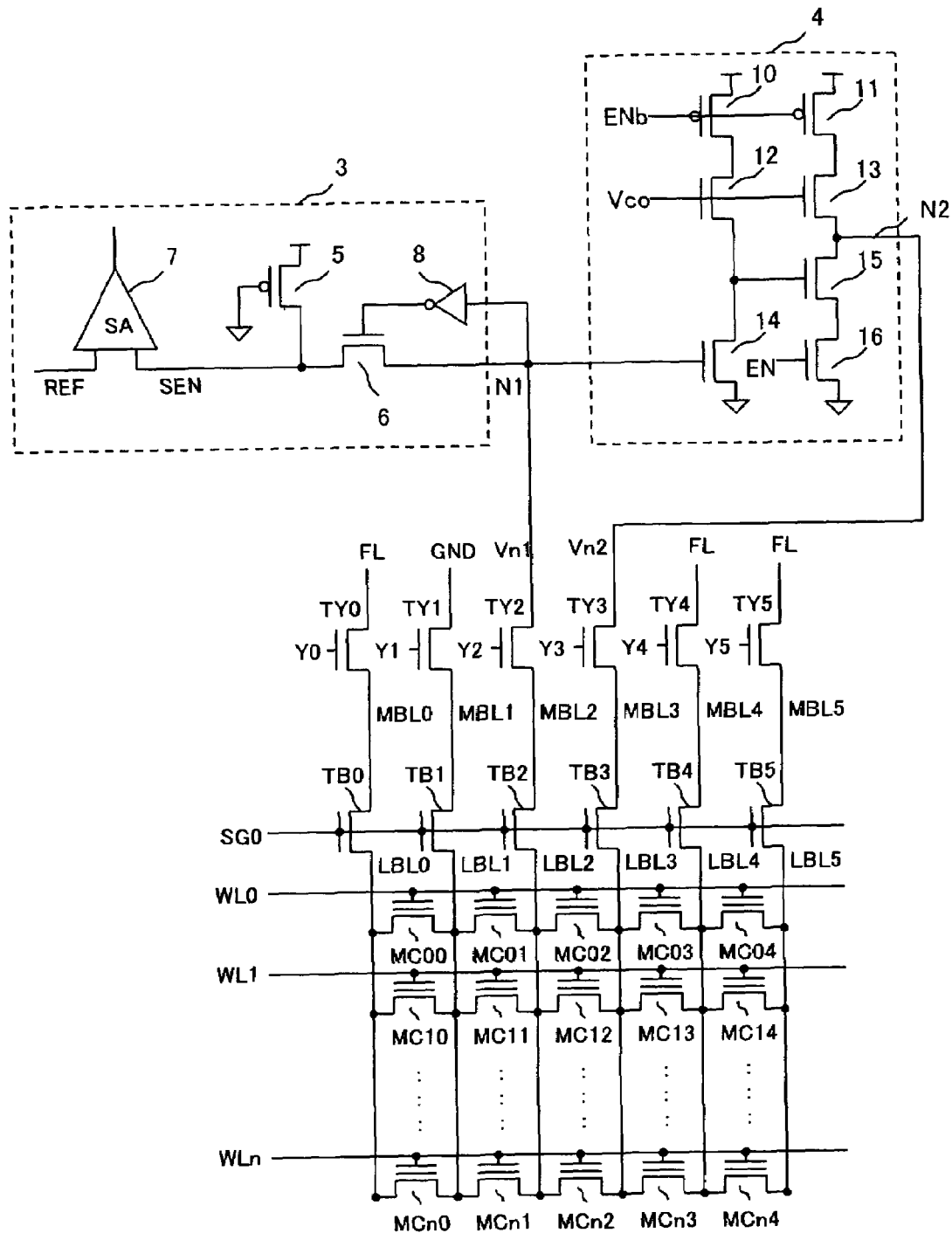
FIG. 1 is a primary part circuitry diagram schematically showing a combination of a memory cell array and readout circuits of a semiconductor memory device as the first embodiment of the invention.

FIG. 1 illustrates a schematic circuitry arrangement including a memory cell array 2 of a virtual ground line type and a readout circuit in the inventive device 1. It is assumed in this embodiment, the memory cell array 2 comprises an array of flash memory cells of MOSFET type having floating gates. Such a flash memory cell is arranged in which its memory state is determined by a known write and erase action controlling the number of electrons accumulated in the floating gate thus to vary the threshold voltage at each memory cell.

As shown in FIG. 1, the memory cell array 2 in the inventive device 1 has each row of memory cells MCij (i: row number, j: column number) connected at the control gate (equivalent to the first electrode) to a common word line WLi (i ranging from 0 to n). Any two adjacent memory cells MCij and MCi(j+1) along the row are connected with the source or drain of one sharing a diffusion area with the source or drain of the other. The memory cells MCij of each column are connected at the source (or the drain) to a common local bit line LBLj (equivalent to the first bit line) and at the drain (or the source) to a common local bit line LBL(j+1) (equivalent to the second bit line). Also, the first bit lines LBLj and the second bit lines LBL(j+1) extend alternately. It should be noted for ease of the description that as each pair of the first and second bit lines are connected to the source and drain of a corresponding memory cell to be read, one of them which is connected to the drain is referred to as a selected bit line and the other connected to the source is referred to as a selected source line. Hence, the paired selected bit lines represent one selected bit line and one selected source line. Also, the other first and second bit lines than the paired selected bit lines are referred to as unselected bit lines.

In this embodiment, the memory cell array 2 is arranged of a block construction as is divided into blocks. The local bit lines LBLj in each block are connected by a block select transistor TBj to a main bit line MBLj. The main bit line MBLj will be connected via a column select transistor TYj to an output node N1 in the readout circuit 3 when the local bit lines LBLj are selected bit lines. When the local bit lines LBLj are selected source lines, the main bit line MBLj will be connected to the ground potential GND. When the local bit line LBLj are unselected bit lines next to the selected bit lines (referred to as "specific unselected bit lines" hereinafter), the main bit line MBLj will be connected to an output node N2 in a counter potential generation circuit 4. When the local bit lines LBLj are unselected bit lines other than the specific unselected bit lines, the main bit line MBLj will be turned to a floating state FL. While one group of the column select transistors TYj are illustrated for simplicity in FIG. 1, there are also provided a first group of the column select transistors for connecting the main bit line MBLj to the output node N1 of the readout circuit 3, a second group of the column select transistors for connecting the same to the ground potential GND, and a third group of the column select transistors for connecting the same to the output node N2 of the counter potential generation circuit 4. Assuming that the memory cell array is arranged with the selected source lines selected from the first bit lines and the selected bit lines selected from the second bit lines, the specific unselected bit lines are at the first bit line side. Accordingly, the main bit line connected to the first bit lines is connected with the second and third groups of the column select transistors while the second bit lines are connected with the first group of the column select transistors. When the column select transistors remain turned off, their corresponding main bit line is held at the floating state.

The readout circuit 3 comprises a memory cell current supply circuit composed of a load circuit 5 for supplying the main bit line connected by the column select transistor to the selected bit line with a bit line potential for the readout action, a series circuit of an N-channel MOSFET 6 (simply referred to as "NMOS" hereinafter) in a cascade arrangement, and an inverter 8 and a differential amplifier circuit or a sense amplifier 7 having one of its two inputs at the joint SEN between the load circuit 5 and the NMOS 6 and the other input at the reference node REF. The load circuit 5 may be implemented by a P-channel MOSFET (simply referred to as "PMOS" hereinafter) which is connected at the gate to the ground, at the source to the source voltage, and at the drain to the drain of the NMOS 6. The NMOS 6 is connected at the source to the output node N1 of the readout circuit 3 (an intermediate node on the current path for supplying the memory cell current) and at the gate to the output of the inverter 8 of which the input is connected with the output node N1. This allows the potential Vn1 at the output node N1 to vary depending on the memory cell current through the memory cell of interest while remaining slightly lower than an inverse of the input at the inverter 8. On the other hand, the potential at the joint SEN is varied greater than the potential Vn1 at the output node N1 as the memory cell current changes. The reference node REF connected to the other input of the sense amplifier 7 may be accompanied with a dummy memory cell where the current is at an intermediate level between two storage levels (large and small of binary value) which is determined depending on the storage state of the memory cell current. The dummy memory cell is used together with a dummy readout circuit which simulates the readout circuit 3 for generating the voltage at the joint SEN when the reference node REF is at the intermediate level (see FIG. 3).

Figure 2:
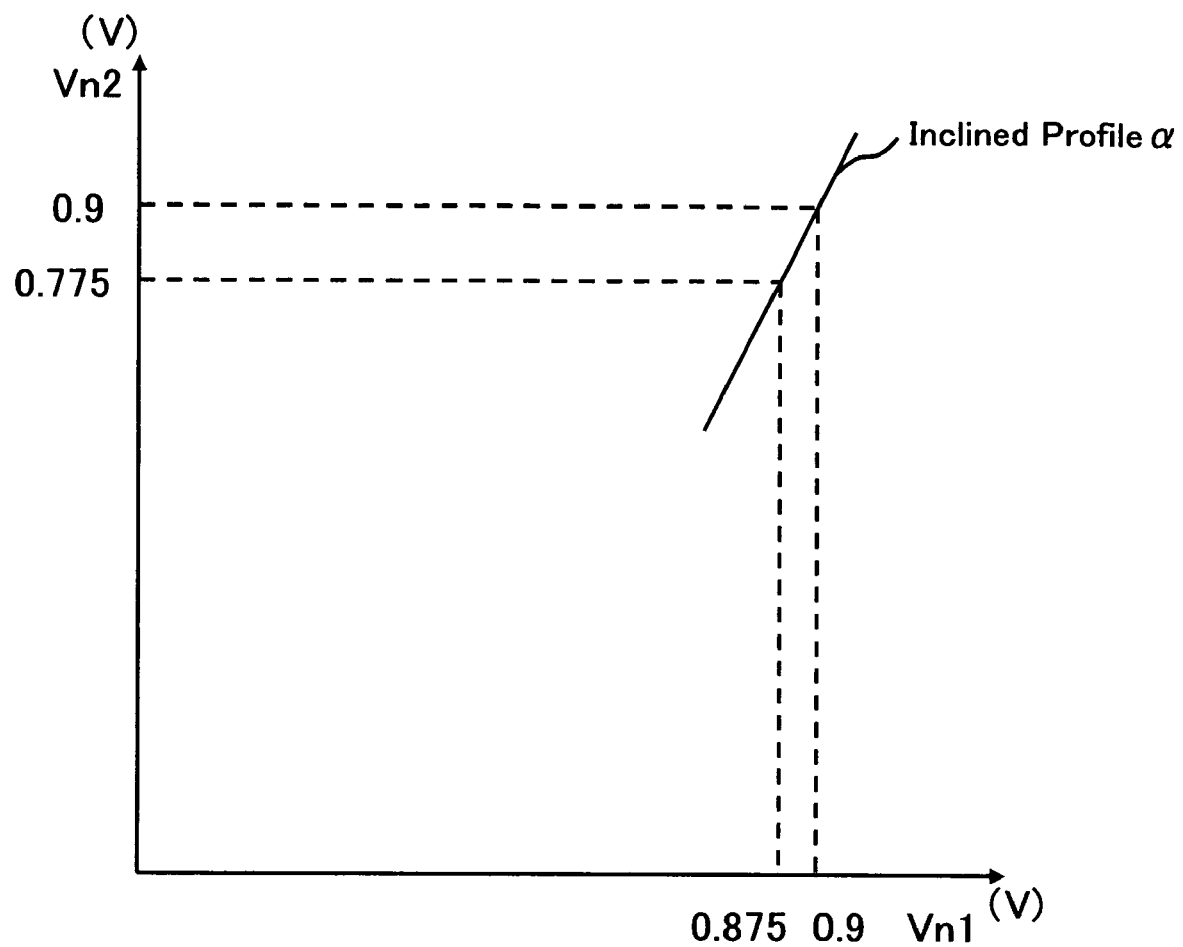
FIG. 2 is a characteristic diagram showing the input/output characteristic of a counter potential generation circuit in the semiconductor memory device of the invention.

The counter potential generation circuit 4 is a single-stage amplifier circuit with the source connected to the ground. There are also provided PMOSs 10 and 11 and the NMOS 16 of transistors for activating the counter potential generation circuit 4. The transistors are turned on when the readout action is conducted and off when the standby mode is called. Two NMOSs 12 and 13 are loaded at the gate with a constant voltage Vco as connected in a cascade arrangement for improving the amplifying rate. An NMOS 14 is arranged for amplifying its input voltage (which is the potential Vn1 at the output node N1 of the readout circuit 3) to increase the amplitude of a gate voltage on an NMOS 15. FIG. 2 illustrates an input/output characteristic of the counter potential generation circuit 4 where the output voltage Vn2 is increased greater than the input voltage Vn1 as the input and output voltages are expressed by substantially a linear relationship. For example, when the amplifying rate is 5, the input voltage Vn1 ranging from 0.875 V to 0.9 V produces the output voltage Vn2 of 0.775 V to 0.9 V.

The readout action of the memory cell array 2 shown in FIG. 1 will now be described where a memory cell MC01 is to be read.

It is noted that the initial state prior to the readout action remains with all the word lines and the bit lines (including the first and second bit lines) connected to the ground. The action starts with selecting the word line WL0 connected with the control gate of a selected memory cell MC01 to be read and applying the same with a gate voltage Vcg. The other unselected word lines remain at the ground level. Then, the output potential Vn1 of the readout circuit 3 is applied via the main bit line MBL2 to the selected bit line LBL2 connected to the drain of the selected memory cell MC01. Simultaneously, the output potential Vn1 is transferred to the counter potential generation circuit 4 of which the output potential Vn2 is fed via the main bit lime MBL3 to the specific unselected bit line LBL3 allocated next to the selected bit line LBL2. While the selected source line LBL1 connected to the source of the selected memory cell MC01 remains at the ground level GND, the other unselected bit lines than the specific unselected bit line LBL3 are held at the floating state. It may arbitrarily be determined whether the selected word line WL0 or the selected bit line LBL2 is first applied with the voltage.

This is followed by applying the control gate of the selected memory cell MC01 with the readout gate voltage Vcg and the drain with the output potential Vn1. Accordingly, the memory cell current is turned to a large level when the threshold voltage of the selected memory cell MC01 is low. Because of a high level of the memory cell current and a difference in the potential at the parasitic resistance including the bit line resistance in the selected bit line and the resistance in the action of the transistors, the potential at the drain of the selected memory cell MC01 drops down to a level lower than the output potential Vn1. Also, the output potential Vn1 of the readout circuit 3 will drop down slightly due to the memory cell current being supplied via the load circuit 5 and the NMOS 6 in the readout circuit 3. However, a drop down in the output potential Vn1 is much smaller than the decrease in the drain potential of the selected memory cell MC01. The counter potential Vn2 to be supplied to the specific unselected bit line LBL3 can be set equal to or lower than the drain potential of the selected memory cell MC01 by matching the inclined profile α (of the amplifying rate) of the input/output characteristic of the counter potential generation circuit 4 shown in FIG. 2 with a rate of the drop down of the output potential Vn1 to the drop down of the drain potential of the selected memory cell MC01. Accordingly, the leak current running from the specific unselected bit line LBL3 via the unselected memory cell MC02 allocated next to the selected memory cell MC01 to the selected bit line can be inhibited almost perfectly. When the unselected memory cells MC02 and MC03 have a potential of Vcg at the control gate connected to the specific unselected bit line LBL3, its source and drain voltages are substantially 0 V and its drain remains at the floating state. Accordingly, the leak current of each unselected memory cell can be minimized thus allowing the counter potential Vn2 applied to the specific unselected bit line LBL3 to be transferred directly to the source of the unselected memory cell MC02.

On the contrary, when the threshold voltage of the selected memory cell MC01 is high, the memory cell current is small. Because of a low level of the memory cell current and a difference in the potential at the parasitic resistance including the bit line resistance in the selected bit line and the resistance in the action of the transistors, the potential at the drain of the selected memory cell MC01 drops down to a level not lower than the output potential Vn1. As the input voltage Vn1 of the counter potential generation circuit 4 is almost unchanged, the counter potential output Vn2 applied to the specific unselected bit line LBL3 drops down not significantly but remains equal to or higher than the drain potential of the selected memory cell MC01. Accordingly, the leak current running from the selected bit line to the specific unselected bit line LBL3 via the unselected memory cell MC02 allocated next to the selected memory cell MC01 can be inhibited almost perfectly. In other words, the potential at the joint SEN which reflects by 100% the memory cell current in the selected memory cell MC01 can be compared with the reference potential at the reference node REF by the sense amplifier 7 regardless of the threshold voltage or the memory cell current at the selected memory cell MC01. As a result, the readout action is prevented from its margin factor being declined by the leak current and can thus be speeded up.

Figure 3:
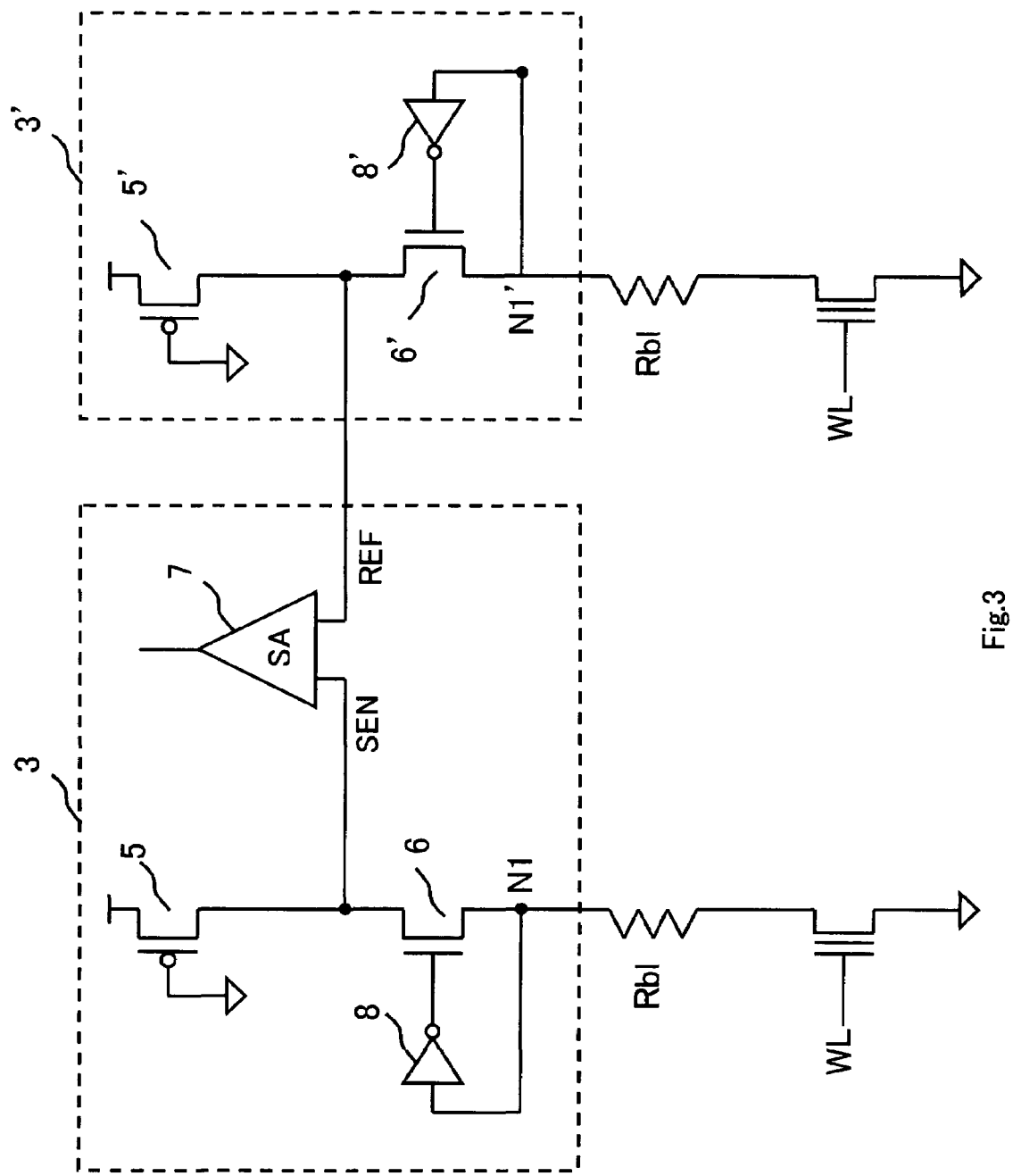
FIG. 3 illustrates a model of a current feeding path for a memory cell current, showing the readout circuit with bit lines and memory cells in the semiconductor memory device of the invention.
Figure 4:
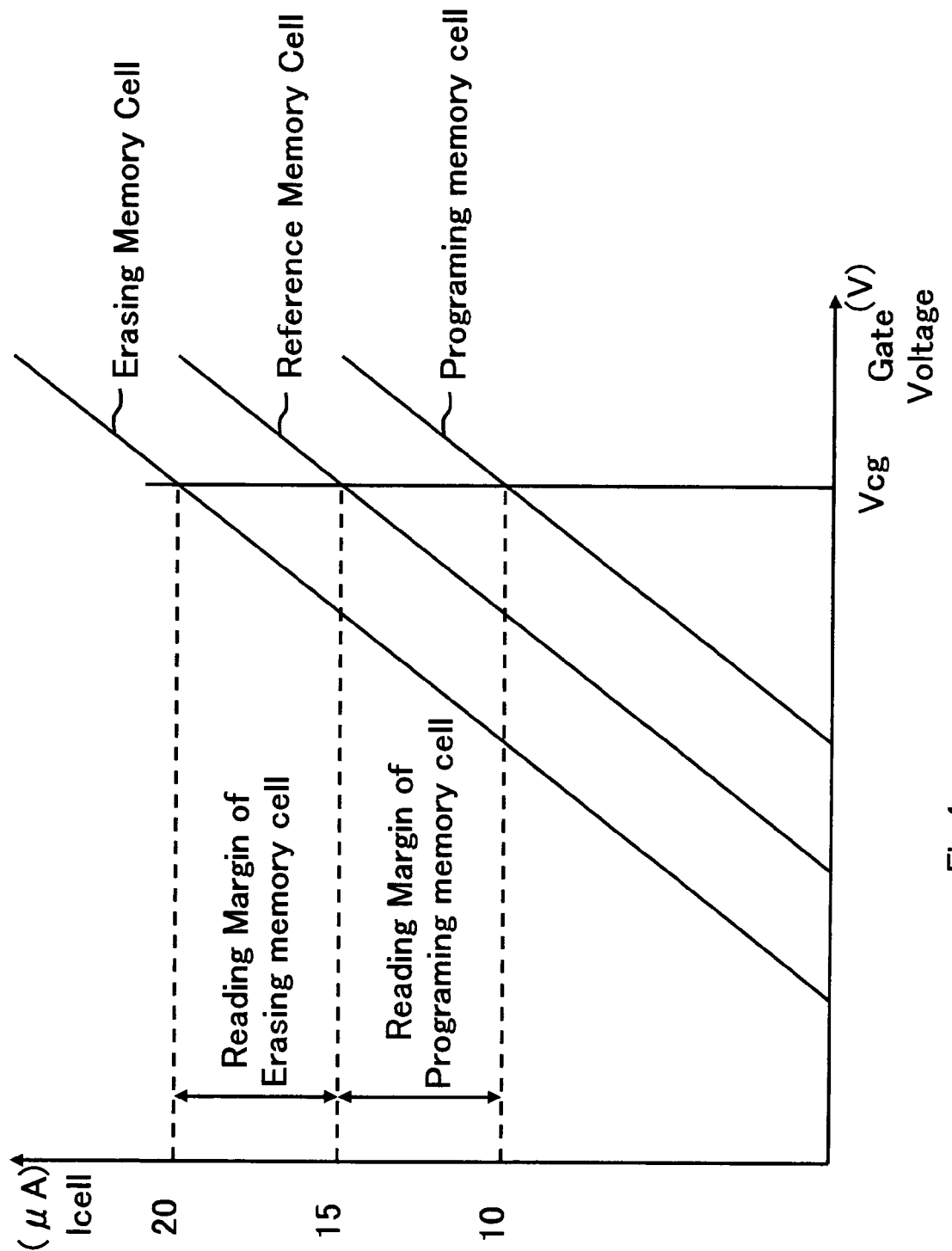
FIG. 4 is a characteristic diagram of the memory cell current in the semiconductor memory device of the invention.

The action of determining the inclination profile α (of the amplifying rate) of the input/output characteristic of the counter potential generation circuit 4 will be described for having the counter potential Vn2 compensated for a drop down in the drain voltage at the selected memory cell. The optimum of the inclination profile α is calculated by a combination of the arrangement of the memory cell array (the bit line resistance), the current property of the memory cells, and the readout circuit 3. FIG. 3 illustrates a model of the current feeding path which is composed of the readout circuit 3, the bit line, and the memory cell. The current feeding path comprises two systems at both, left and right, sides of the sense amplifier 7. The left system is a main current feeding path for the selected memory cell to be read while the right system is a dummy current feeding path for generating the reference potential. The two systems are disposed in symmetric relationship. The dummy current feeding path is implemented by a dummy readout circuit 3' which comprises a load circuit 5', an NMOS 6' connected in a cascade arrangement, and an inverter 8' which are identical to the load circuit 5, the cascade connected NMOS 6, and the inverter 8 in the readout circuit 3. A bit line resistance Rb1 is determined by the memory cell array arrangement. When the memory cell array arrangement has a hierarchy construction, the bit line resistance is a combination of series connected resistances including local bit line interconnecting resistance, block selected transistor on resistance, main bit line interconnecting resistance, and column selected transistor on resistance. It is assumed that the bit line resistance Rb1 is set to 10 kΩ. A memory cell current Icell is determined by the drain current Id, the I–V characteristic of the gate voltage Vg, and the word line voltage Vcg in the memory cell of interest as shown in FIG. 4. Three profiles of the I–V characteristic shown in FIG. 4 represent one of the erase memory cell where the threshold voltage is maximum at Vthe in the erased state, one of the write memory cell where the threshold voltage is minimum at Vthp in the written state, and one of the reference memory cell where the threshold voltage is intermediate at Vthr between the maximum and the minimum. When the selected memory cell has been erased, its memory cell current Icell is 20 µA with 10 kΩ of the bit line resistance Rb1 in the example shown in FIG. 4. Accordingly, the selected memory cell is declined at the drain by 200 mV from the output potential Vn1 at the output node N1 of the readout circuit 3. Also, when the selected memory cell has been written, its memory cell current Icell is 10 µA with 10 kΩ of the bit line resistance Rb1. Accordingly, the selected memory cell is declined at the drain by 100 mV from the output potential Vn1 at the output node N1 of the readout circuit 3. Assuming that the output potential Vn1 at the output node N1 is declined by 25 mV as the selected memory cell is shifted from the written mode to the erased mode, the bit line voltage at the drain of the selected memory cell is turned down 125 mV from the written mode to the erased mode. As the output potential Vn1 at the output node N1 changes 25 mV, the bit line voltage at the drain of the selected memory cell is varied by 125 mV and the inclination α will be five.

SECOND EMBODIMENT

Figure 5:
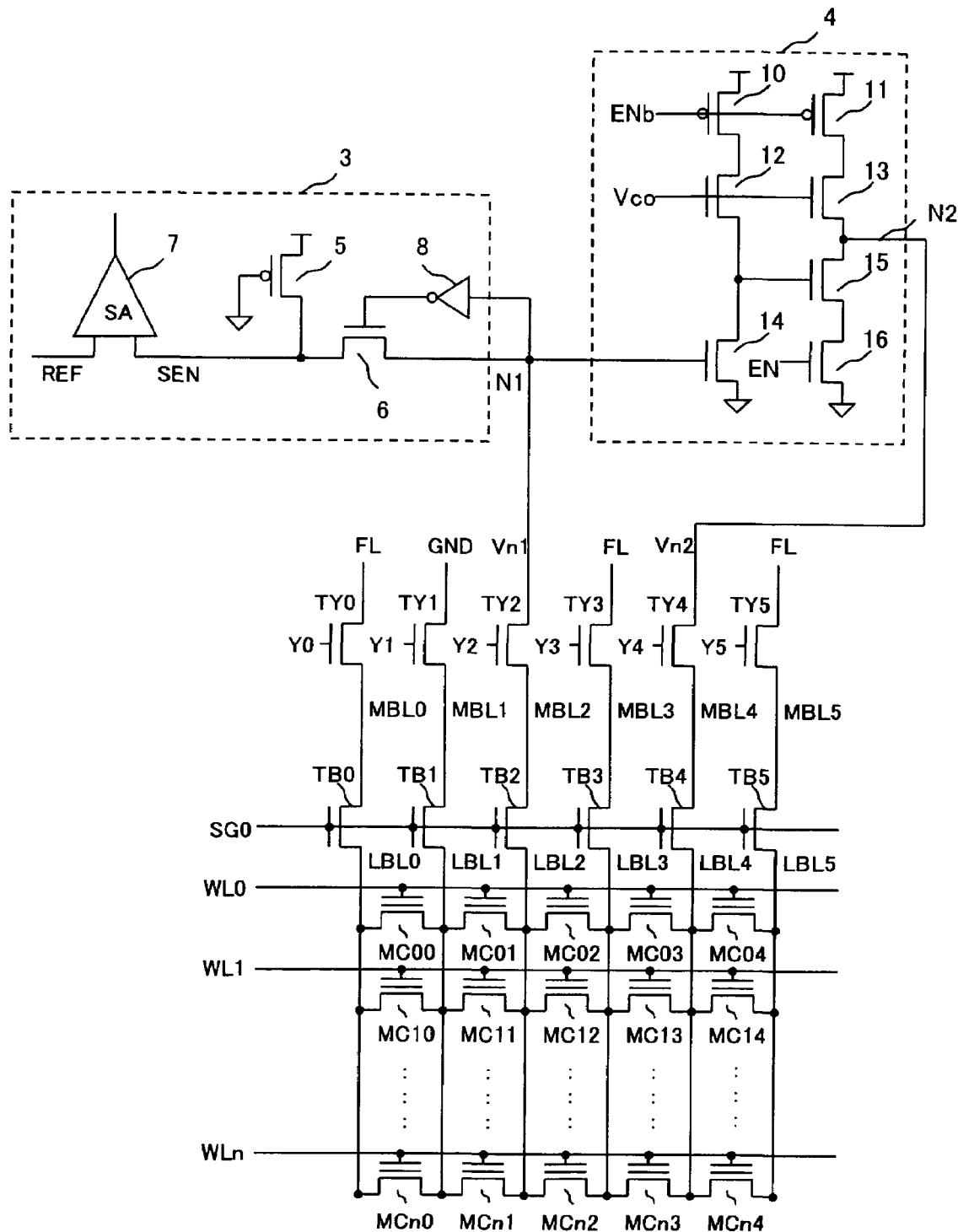
FIG. 5 is a primary part circuitry diagram schematically showing a combination of a memory cell array and readout circuits of a semiconductor memory device as the second embodiment of the invention.

A second embodiment of the inventive device 1 will be described. FIG. 5 illustrates a schematic arrangement of a virtual ground line type memory cell array 2 and its readout and other circuits of the second embodiment of the inventive device 1. The memory cell array 2, the readout circuit 3, and the counter potential generation circuit 4 are identical to those of the first embodiment and will be explained in no more detail to avoid a duplication of the description.

The second embodiment is different from the first embodiment by the fact that the local bit line LBLj corresponding to the main bit line MBLj connected with the output node N2 of the counter potential generation circuit 4 is not an unselected bit line arranged next to the selected bit line but an unselected bit line separated by one adjacent unselected bit line from the selected bit line. For example, as shown in FIG. 5, when the memory cell MC01 is to be read and its selected bit line is LBL2, the main bit line MBL4 will be connected to the output node N2 of the counter potential generation circuit 4 and the local bit line LBL4 will be a specific unselected bit line (which is connected by the corresponding main bit line to the output node N2 of the counter potential generation circuit 4).

More particularly, in the second embodiment, the main bit line MBLj will be connected via the column select transistor TYj to the output node N1 of the readout circuit 3 when its corresponding local bit line LBLj is a selected bit line, to the ground potential GND when it is a selected source line, and to the output node N2 of the counter potential generation circuit 4 when it is an unselected bit line separated by another unselected bit line from the selected bit line (which is thus designated as "specific unselected bit line" in the second embodiment), or remain in the floating state FL when the local bit line LBLj is any other unselected bit line than the specific unselected bit line.

The action of selecting and reading the memory cell MC01 as a memory cell to be read in the memory cell array 2 shown in FIG. 5 will now be described.

It is noted that the initial state prior to the readout action remains with all the word lines and the bit lines (including the first and second bit lines) connected to the ground. The action starts with selecting the word line WL0 connected with the control gate of a selected memory cell MC01 to be read and applying the same with a gate voltage Vcg. The other unselected word lines remain at the ground level. Then, the output potential Vn1 of the readout circuit 3 is applied via the main bit line MBL2 to the selected bit line LBL2 connected to the drain of the selected memory cell MC01. Simultaneously, the output potential Vn1 is transferred to the counter potential generation circuit 4 of which the output potential Vn2 is applied via the main bit lime MBL4 to the specific unselected bit line LBL4 separated by another unselected bit line LBL3 from the selected bit line LBL2. While the selected source line LBL1 connected to the source of the selected memory cell MC01 remains at the ground level GND, the other unselected bit lines than the specific unselected bit line LBL4 are held at the floating state. It may arbitrarily be determined whether the selected word line WL0 or the selected bit line LBL2 is first applied with the voltage.

This is followed by applying the control gate of the selected memory cell MC01 with the readout gate voltage Vcg and the drain with the output potential Vn1. Accordingly, the memory cell current is turned to a large when the threshold voltage of the selected memory cell MC01 is low. Because of a high level of the memory cell current and a difference in the potential at the parasitic resistance including the bit line resistance in the selected bit line and the resistance in the action of the transistors, the potential at the drain of the selected memory cell MC01 drops down to a level lower than the output potential Vn1. Also, the output potential Vn1 of the readout circuit 3 will drop down slightly due to the memory cell current being supplied via the load circuit 5 and the NMOS 6 in the readout circuit 3. However, a drop down in the output potential Vn1 is much smaller than the decrease in the drain potential of the selected memory cell MC01. The counter potential Vn2 to be applied to the specific unselected bit line LBL4 can be set equal to the drain potential of the selected memory cell MC01 by matching the inclined profile α (of the amplifying rate) of the input/output characteristic of the counter potential generation circuit 4 shown in FIG. 2 with a rate of the drop down of the output potential Vn1 to the drop down of the drain potential of the selected memory cell MC01. This allows the potential at the unselected bit line LBL3 allocated next to the selected bit line LBL2 to be equal to the drain potential or an intermediate level between the counter potential Vn2 and the drain potential of the selected memory cell MC01 through the two unselected memory cells MC02 and MC03 of which the control gate potential is Vcg. Accordingly, the leak current running from the unselected bit line LBL3 to the selected bit line via the unselected memory cell MC02 allocated next to the selected memory cell MC01 can be inhibited almost perfectly.

On the contrary, when the threshold voltage of the selected memory cell MC01 is high, the memory cell current is small. Because of a low level of the memory cell current and a difference in the potential at the parasitic resistance including the bit line resistance in the selected bit line and the resistance in the action of the transistors, the potential at the drain of the selected memory cell MC01 drops down to a level not lower than the output potential Vn1. As the input potential Vn1 of the counter potential generation circuit 4 is almost unchanged, the counter potential output Vn2 to be received by the specific unselected bit line LBL4 drops down not significantly but remains equal to or higher than the drain potential of the selected memory cell MC01. Also, the potential at the unselected bit line LBL3 will remain equal to or higher than the drain potential. Accordingly, the leak current running from the selected bit line to the unselected bit line LBL3 via the unselected memory cell MC02 allocated next to the selected memory cell MC01 can be inhibited almost perfectly. In other words, the potential at the joint SEN which reflects by 100% the memory cell current in the selected memory cell MC01 can be compared with the reference potential at the reference node REF by the sense amplifier 7 regardless of the threshold voltage or the memory cell current of the selected memory cell MC01. As a result, the readout action is prevented from its margin factor being declined by the leak current and can thus be speeded up.

Since its potential difference between the selected bit line LBL2 and its adjacent unselected bit line LBL3 is attenuated to a half the potential difference created between the counter potential Vn2 and the drain potential of the selected memory cell MC01, the second embodiment can inhibit the leak current more effectively as compared with the first embodiment where a similar difference in the potential is occurred.

THIRD EMBODIMENT

Figure 6:
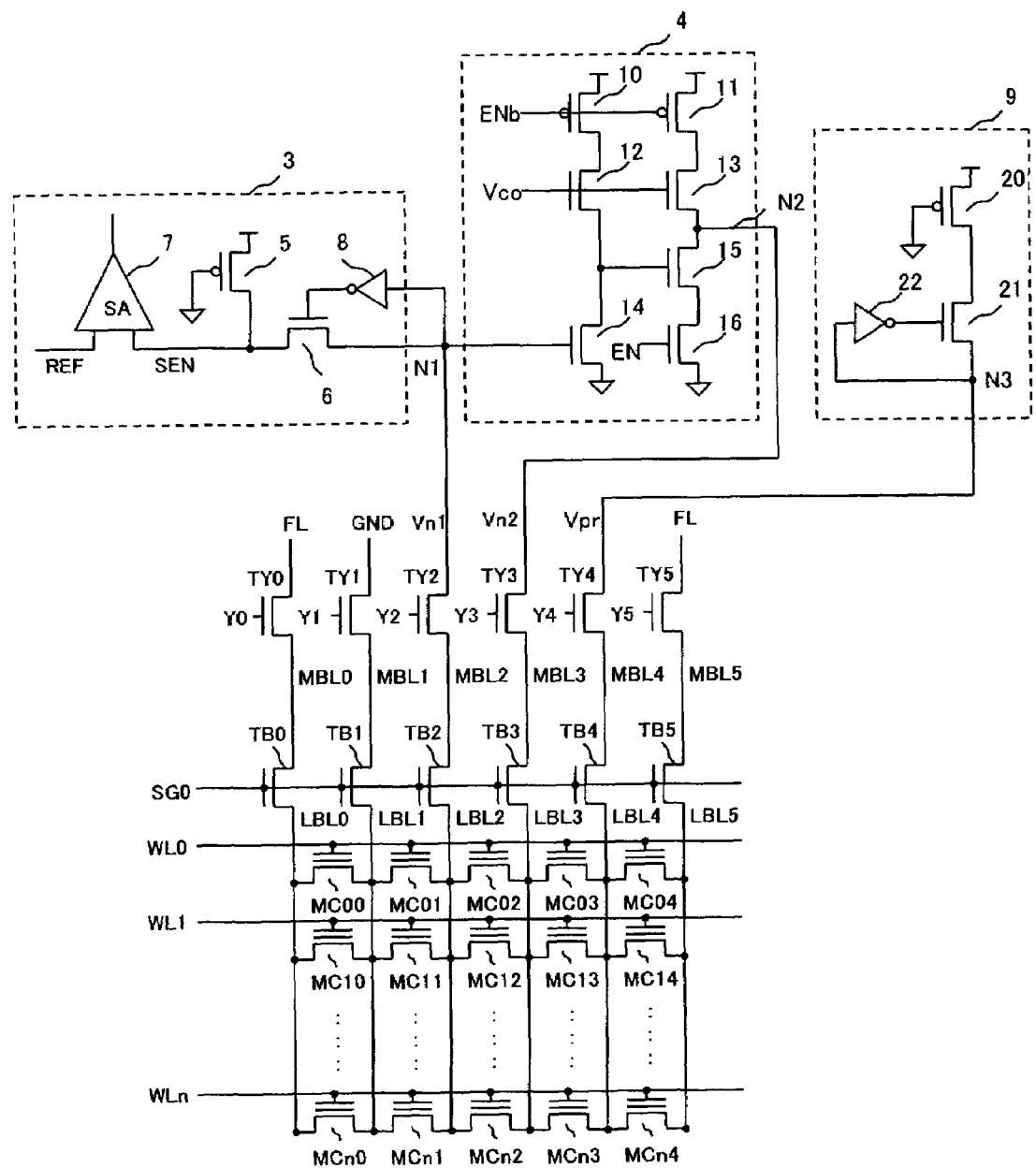
FIG. 6 is a primary part circuitry diagram schematically showing a combination of a memory cell array and readout circuits of a semiconductor memory device as the third embodiment of the invention.

A third embodiment of the inventive device 1 will be described. FIG. 6 illustrates a schematic arrangement of a virtual ground line type memory cell array 2 and its readout and other circuits of the third embodiment of the inventive device 1. The third embodiment is a modification of the first embodiment. The memory cell array 2, the readout circuit 3, and the counter potential generation circuit 4 are identical to those of the first embodiment and will be explained in no more detail to avoid a duplication of the description.

The third embodiment is different from the first embodiment by a precharge circuit 9 arranged for, simultaneously at the time of charging the selected bit line and the specific unselected bit line, feeding the unselected bit line allocated next to the specific unselected bit line at the opposite side to the selected bit line with a predetermined precharge potential Vpr which is lower than the lower limit of the output potential Vn2 from the output node N2 of the counter potential generation circuit 4 while the main bit line corresponding to the unselected bit line is connected via the column select transistor to an output node N3 of the precharge circuit 9.

The precharge circuit 9 is substantially identical in the circuitry arrangement to the memory cell current feed circuit, which is composed of the load circuit 5, the NMOS 6, and the inverter 8 in the readout circuit 3, and more specifically comprises a PMOS 20, an NMOS 21, and an inverter 22. An inverse of the input of the inverter 22 is set close to the precharge potential Vpr which is slightly lower than that of the inverter 8 in the readout circuit 3.

The action of selecting and reading the memory cell MC01 as a memory cell to be read in the memory cell array 2 shown in FIG. 6 will now be described.

It is noted that the initial state prior to the readout action remains with all the word lines and the bit lines (including the first and second bit lines) connected to the ground. The action starts with selecting the word line WL0 connected with the control gate of a selected memory cell MC01 to be read and applying the same with a gate voltage Vcg. The other unselected word lines remain at the ground level. Then, the output potential Vn1 of the readout circuit 3 is applied via the main bit line MBL2 to the selected bit line LBL2 connected to the drain of the selected memory cell MC01. Simultaneously, the output potential Vn1 is transferred to the counter potential generation circuit 4 of which the output potential Vn2 is applied via the main bit lime MBL3 to the specific unselected bit line LBL3 allocated next to the selected bit line LBL2. The unselected bit line LBL4 allocated next to the specific unselected bit line LBL3 is then loaded with a precharge potential Vpr received via the main bit line MBL4 from the precharge circuit 9. While the selected source line LBL1 connected to the source of the selected memory cell MC01 remains at the ground potential GND, the other unselected bit lines than the specific unselected bit line LBL3 and the unselected bit line LBL4 are held at the floating state. It may arbitrarily be determined whether the selected word line WL0 or the selected bit line LBL2 is first applied with the voltage. As the unselected bit line LBL4 has been fed with the precharge potential Vpr, the output level of the inverter 22 in the precharge circuit 9 drops down. This cuts off the NMOS 21 thus turning the unselected bit line LBL4 to the floating state where the precharge potential Vpr remains held.

This is followed by applying the control gate of the selected memory cell MC01 with the readout gate voltage Vcg and the drain with the output voltage Vn1. Accordingly, the memory cell current is turned to be large when the threshold voltage of the selected memory cell MC01 is low. Because of a high level of the memory cell current and a difference in the potential at the parasitic resistance including the bit line resistance in the selected bit line and the resistance in the action of the transistors, the potential at the drain of the selected memory cell MC01 drops down to a level lower than the output potential Vn1. Also, the output potential Vn1 of the readout circuit 3 will drop down slightly due to the memory cell current being supplied via the load circuit 5 and the NMOS 6 in the readout circuit 3. However, a drop down in the output potential Vn1 is much smaller than the decrease in the drain potential of the selected memory cell MC01. The counter potential Vn2 to be applied to the specific unselected bit line LBL3 can be set equal to or lower than the drain potential of the selected memory cell MC01 by matching the inclined profile α (of the amplifying rate) of the input/output characteristic of the counter potential generation circuit 4 shown in FIG. 2 with a rate of the drop down of the output potential Vn1 to the drop down of the drain potential of the selected memory cell MC01. Accordingly, the leak current running from the specific unselected bit line LBL3 to the selected bit line via the unselected memory cell MC02 allocated next to the selected memory cell MC01 can be inhibited almost perfectly. Meanwhile, one of the two unselected memory cells MC02 and MC03, of which the potential at the control gate connected to the specific unselected bit line LBL3 is Vcg, receives substantially 0 V at the source and drain and the other is loaded with the precharge potential Vpr at the drain. This allows the specific unselected bit line LBL3 and the unselected bit line LBL4 to be charged up to the counter potential Vn2 within a shorter charging period, thus minimizing the leak current from the unselected memory cells at an earlier stage. As a result, the counter potential Vn2 applied to the specific unselected bit line LBL3 can be transferred directly to the source of the unselected memory cell MC02.

On the contrary, when the threshold voltage of the selected memory cell MC01 is high, the memory cell current is small. Because of a low level of the memory cell current and a difference in the potential at the parasitic resistance including the bit line resistance in the selected bit line and the resistance in the action of the transistors, the potential at the drain of the selected memory cell MC01 drops down to a level not lower than the output potential Vn1. As the input voltage Vn1 of the counter potential generation circuit 4 is almost unchanged, the counter potential Vn2 to be received by the specific unselected bit line LBL3 drops down not significantly but remains equal to or higher than the drain potential of the selected memory cell MC01. Accordingly, the leak current running from the selected bit line to the specific unselected bit line LBL3 via the unselected memory cell MC02 allocated next to the selected memory cell MC01 can be inhibited almost perfectly. In other words, the potential at the joint SEN which reflects by 100% the memory cell current in the selected memory cell MC01 can be compared with the reference potential at the reference node REF by the sense amplifier 7 regardless of the threshold voltage or the memory cell current of the selected memory cell MC01. As a result, the readout action is prevented from its margin factor being declined by the leak current and can thus be speeded up.

The third embodiment can feed the unselected bit line LBL4 with a charge supplied from the precharge circuit 9 in order to suppress the increase in the leak current from the unselected memory cell MC02 which may occur when the specific unselected bit line LBL3 is lower in the feeding of the counter potential Vn2 and thus retarded in the charge action of the specific unselected bit line LBL3 by sneaking of current on the adjacent unselected bit line LBL4, hence contributing to the speeding up of the readout action.

FOURTH EMBODIMENT

Figure 7:
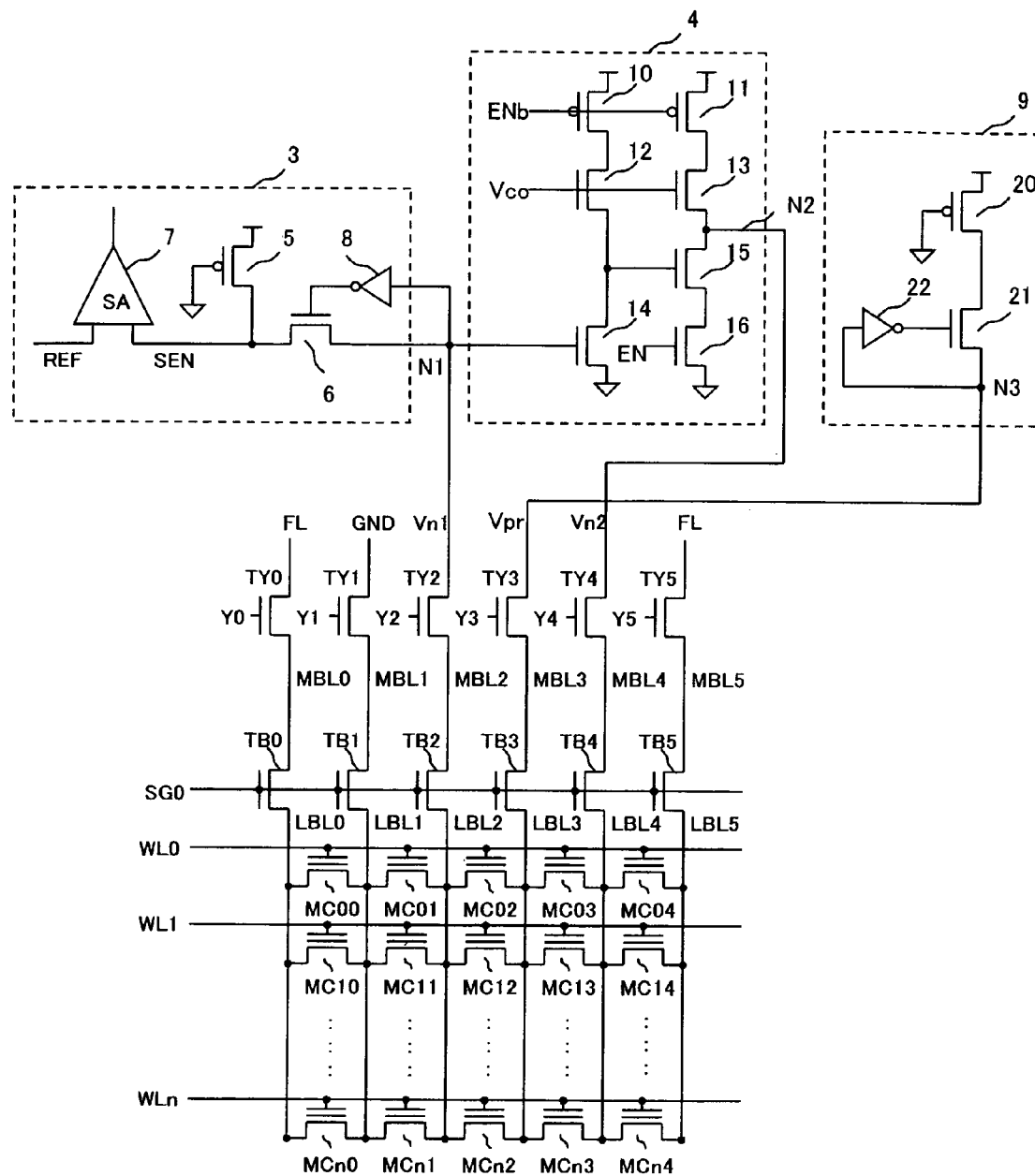
FIG. 7 is a primary part circuitry diagram schematically showing a combination of a memory cell array and readout circuits of a semiconductor memory device as the fourth embodiment of the invention.

A fourth embodiment of the inventive device 1 will be described. FIG. 7 illustrates a schematic arrangement of a virtual ground line type memory cell array 2 and its readout and other circuits of the fourth embodiment of the inventive device 1. The fourth embodiment is a modification of the second embodiment. The memory cell array 2, the readout circuit 3, and the counter potential generation circuit 4 are identical to those of the first or second embodiment and will be explained in no more detail to avoid a duplication of the description.

The fourth embodiment is different from the second embodiment by a precharge circuit 9 arranged for, simultaneously at the time of charging the selected bit line and the specific unselected bit line, feeding the unselected bit line allocated between the specific unselected bit line and the selected bit line with a predetermined precharge potential Vpr which is lower than the lower limit of the output potential Vn2 from the output node N2 of the counter potential generation circuit 4 while the main bit line corresponding to the unselected bit line is connected via the column select transistor to an output node N3 of the precharge circuit 9. The precharge circuit 9 is identical in the circuitry arrangement to that of the third embodiment and its explanation will be omitted.

The action of selecting and reading the memory cell MC01 as a memory cell to be read in the memory cell array 2 shown in FIG. 7 will now be described.

It is noted that the initial state prior to the readout action remains with all the word lines and the bit lines (including the first and second bit lines) connected to the ground. The action starts with selecting the word line WL0 connected with the control gate of a selected memory cell MC01 to be read and applying the same with a gate voltage Vcg. The other unselected word lines remain at the ground level. Then, the output potential Vn1 of the readout circuit 3 is applied via the main bit line MBL2 to the selected bit line LBL2 connected to the drain of the selected memory cell MC01. Simultaneously, the output potential Vn1 is transferred to the counter potential generation circuit 4 of which the output potential Vn2 is applied via the main bit lime MBL4 to the specific unselected bit line LBL4 separated by another unselected bit line LBL3 from the selected bit line LBL2. The unselected bit line LBL3 allocated between the selected bit line LBL2 and the specific unselected bit line LBL4 is then loaded with a precharge potential Vpr received via the main bit line MBL3 from the precharge circuit 9. While the selected source line LBL1 connected to the source of the selected memory cell MC01 remains at the ground level GND, the other unselected bit lines than the specific unselected bit line LBL4 and the unselected bit line LBL3 are held at the floating state. It may arbitrarily be determined whether the selected word line WL0 or the selected bit line LBL2 is first applied with the voltage. As the unselected bit line LBL3 has been fed with the precharge potential Vpr, the output level of the inverter 22 in the precharge circuit 9 drops down. This cuts off the NMOS 21 thus turning the unselected bit line LBL3 to the floating state where the precharge potential Vpr remains held.

This is followed by applying the control gate of the selected memory cell MC01 with the readout gate voltage Vcg and the drain with the output potential Vn1. Accordingly, the memory cell current is turned to large when the threshold voltage of the selected memory cell MC01 is low. Because of a high level of the memory cell current and a difference in the potential at the parasitic resistance including the bit line resistance in the selected bit line and the resistance in the action of the transistors, the potential at the drain of the selected memory cell MC01 drops down to a level lower than the output potential Vn1. Also, the output potential Vn1 of the readout circuit 3 will drop down slightly due to the memory cell current being supplied via the load circuit 5 and the NMOS 6 in the readout circuit 3. However, a drop down in the output potential Vn1 is much smaller than the decrease in the drain potential of the selected memory cell MC01. The counter potential Vn2 to be applied to the specific unselected bit line LBL4 can be set equal to the drain potential of the selected memory cell MC01 by matching the inclined profile α (of the amplifying rate) of the input/output characteristic of the counter potential generation circuit 4 shown in FIG. 2 with a rate of the drop down of the output potential Vn1 to the drop down of the drain potential of the selected memory cell MC01. As the unselected bit line LBL3 allocated next to the selected bit line LBL2 has been charged with the precharge level Vpr from the precharge circuit 9, its potential is equal to the drain potential or an intermediate level between the counter potential Vn2 and the drain potential of the selected memory cell MC01 through the two unselected memory cells MC02 and MC03 of which the control gate potential is Vcg. Accordingly, the leak current running from the unselected bit line LBL3 to the selected bit line via the unselected memory cell MC02 allocated next to the selected memory cell MC01 can be inhibited almost perfectly.

On the contrary, when the threshold voltage of the selected memory cell MC01 is high, the memory cell current is small. Because of a low level of the memory cell current and a difference in the potential at the parasitic resistance including the bit line resistance in the selected bit line and the resistance in the action of the transistors, the potential at the drain of the selected memory cell MC01 drops down to a level not lower than the output potential Vn1. As the input voltage Vn1 of the counter potential generation circuit 4 is almost unchanged, the counter potential Vn2 to be received by the specific unselected bit line LBL4 drops down not significantly but remains equal to or higher than the drain potential of the selected memory cell MC01. Also, as the unselected bit line LBL3 allocated next to the selected bit line LBL2 has been loaded with the precharge level Vpr from the precharge circuit 9, its potential is increased at a higher speed to a level equal to or higher than the drain voltage. Accordingly, the leak current running from the selected bit line to the specific unselected bit line LBL3 via the unselected memory cell MC02 allocated next to the selected memory cell MC01 can be inhibited almost perfectly. In other words, the potential at the joint SEN which reflects by 100% the memory cell current in the selected memory cell MC01 can be compared with the reference potential at the reference node REF by the sense amplifier 7 regardless of the threshold voltage or the memory cell current of the selected memory cell MC01. As a result, the readout action is prevented from its margin factor being declined by the leak current and can thus be speeded up.

The fourth embodiment can feed the unselected bit line LBL3 with a charge supplied from the precharge circuit 9 in order to suppress the increase in the leak current from the unselected memory cell MC02 which may occur when the specific unselected bit line LBL4 is lower in the feeding of the counter voltage Vn2 and thus retarded in the charge action of the specific unselected bit line LBL4 by sneaking of current on the adjacent unselected bit line LBL3, hence contributing to the speeding up of the readout action.

Some more modifications of the first to fourth embodiments will be described.

Figure 8:
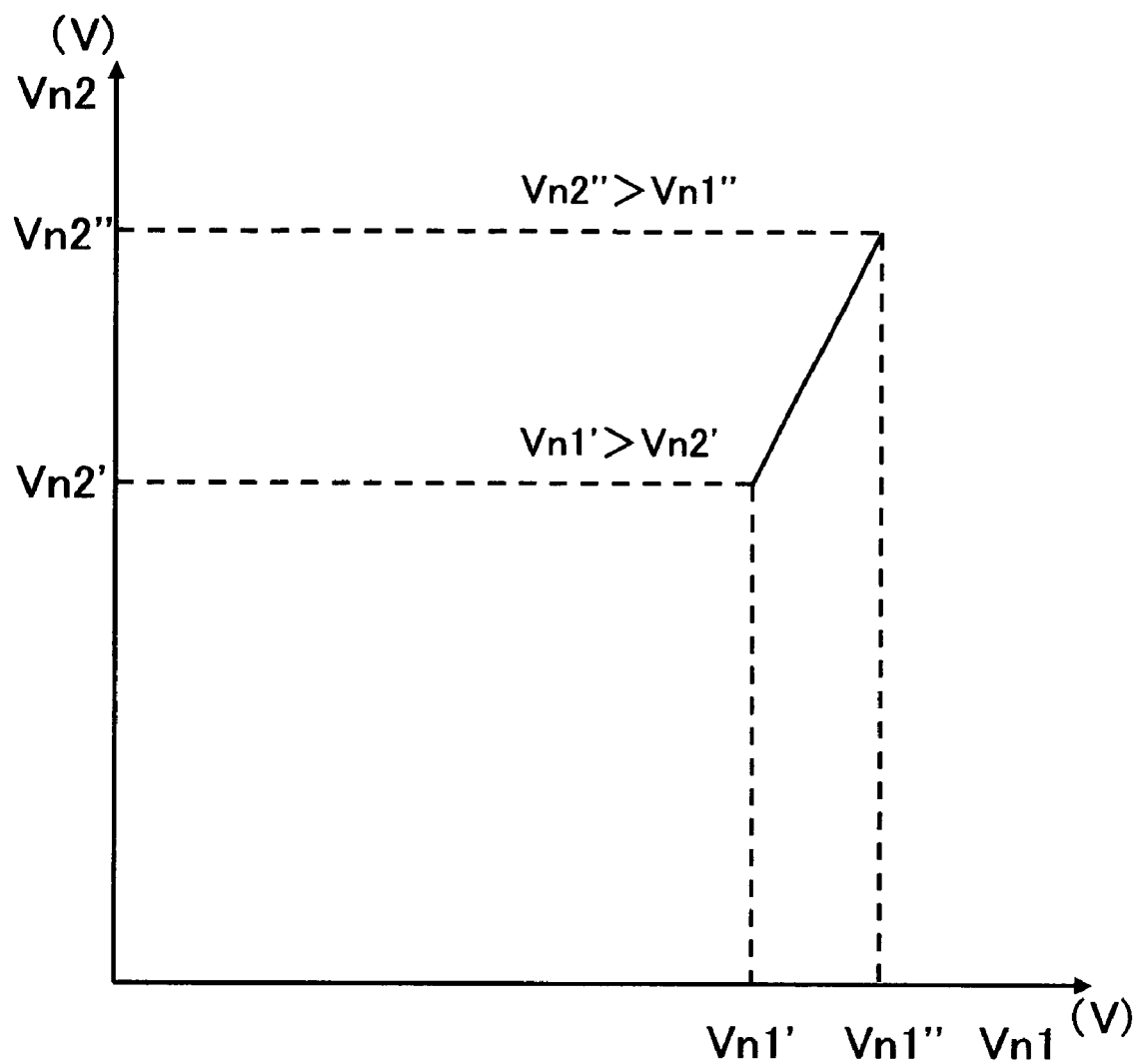
FIG. 8 is a characteristic diagram showing the input/output characteristic of a counter potential generation circuit in the semiconductor memory device as another embodiment of the invention.
Figure 9:
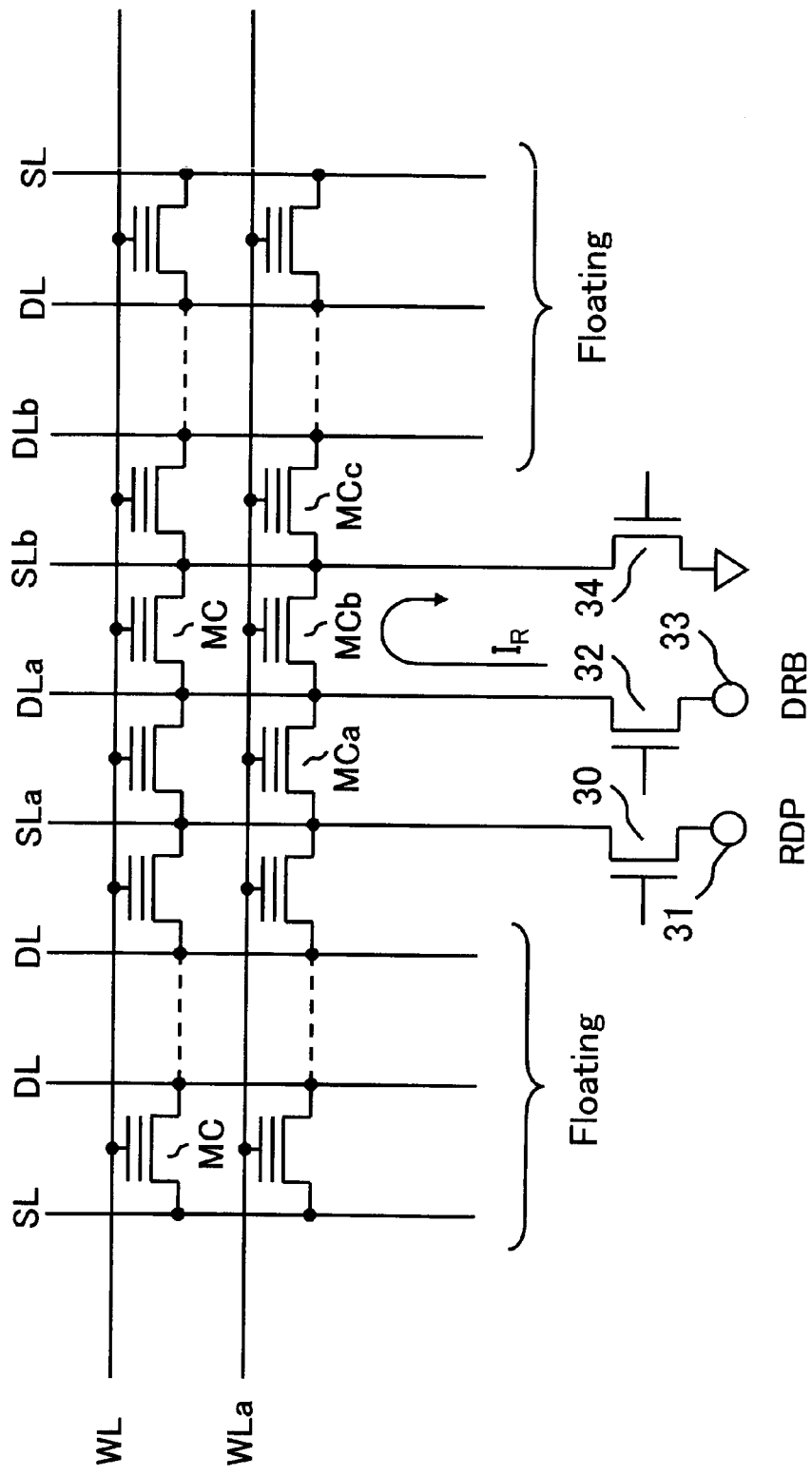
FIG. 9 is an explanatory view showing a conventional readout method for a memory cell array of virtual ground line type.
Figure 10:
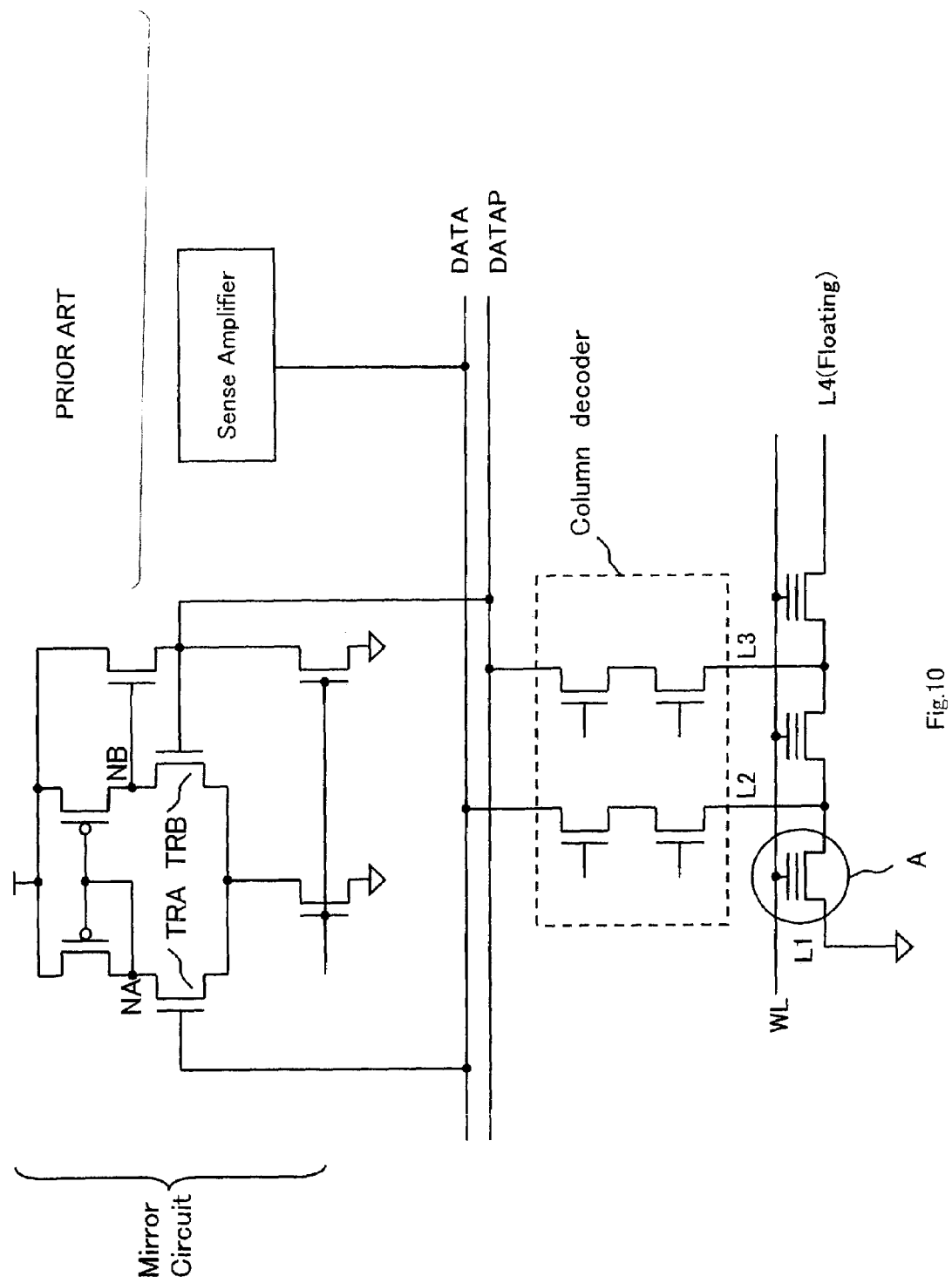
FIG. 10 is an explanatory view showing another conventional readout method for a memory cell array of virtual ground line type.

(1) It is preferable that the output potential Vn2 at the output node N2 of the counter potential generation circuit 4 in any of the first to fourth embodiments is set to a higher level than the input potential Vn1 when the input potential Vn1 is high or to a lower level than the input potential Vn1 when the input potential Vn1 is low. More specifically, as shown in FIG. 8, Vn2'<Vn1' and Vn2">Vn1" are given when the input potential Vn1 varies between Vn1' and Vn1" and the counter potential Vn2 varies between Vn2' and Vn2".

When the threshold voltage of the memory cell to be read is low, the readout current is large and the potential at the drain of the selected memory cell drops down greater. As the counter potential is controlled to a level smaller than the drain potential, the current runs from the selected bit line to the unselected bit line via the unselected memory cell allocated next to the selected memory cell thus increasing the readout current and improving the margin factor of the readout action. On the other hand, when the threshold voltage of the memory cell to be read is high, the readout current is small and the potential at the drain of the selected memory cell drops down smaller. As the counter potential is controlled to a level higher than the drain potential, the current runs from the unselected bit line to the selected bit line via the unselected memory cell allocated next to the selected memory cell thus decreasing the readout current. As a result, the margin factor of the readout action can be improved when the threshold voltage is high.

(2) The memory cell current feed circuit of the readout circuit 3 in any of the first to fourth embodiments are not limited to the above described combination of the load circuit 5, the cascade connected NMOS 6, and the inverter 8 but may be implemented by any applicable arrangement. For example, the output node N1 of the readout circuit 3 may be accompanied with a precharge circuit of which the action is controlled by an internal clock signal. Alternatively, the memory cell current feed circuit may comprise a load circuit 5 and a cascade connected NMOS 6 of which the gate potential is fixedly set with an intermediate bias level. Also, the load circuit 5 may be implemented by any other favorable component than the PMOS grounded at the gate.

(3) The counter potential generation circuit 4 in any of the first to fourth embodiments is not limited to the single-stage amplifying circuit grounded at the source. Also, the output node N2 of the counter potential generation circuit 4 may be accompanied with a precharge circuit of which the action is controlled by an internal clock signal.

(4) According to the first to fourth embodiments, the memory cell in the memory cell array 2 is a flash memory cell of MOSFET structure having a floating gate. The memory cell may be any other memory cell than the flash memory cell. For example, the memory cell may have a fixed level of the threshold voltage determined by the manufacturing process, such as a mask ROM.

(5) The memory cell array 2 in any of the first to fourth embodiments is not limited to the above described arrangement where the first bit line is a selected source line while the second bit line is a selected bit line. Alternatively, the selected bit lines and the selected source lines may be replaced by each other depending on the arrangement of memory cells to be read along the columns. For example, when a multilevel memory cell is employed where two kinds of storage data are stored in a single cell arrangement and read out with the memory cell current introduced in two opposite directions, the selected bit line and the selected source line may be replaced by each other depending on the direction of the memory cell current.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
a memory cell array having a plurality of memory cells arranged in a matrix form of rows and columns, each memory cell having a first electrode and a pair of second electrodes arranged from which memory data can be read out by a conducting state between the two second electrodes according to the first electrode potential, each row of the memory cells connected at their first electrode with a common word line, any two adjacent memory cells connected at one of the two second electrodes to each other along the row, each column of the memory cells connected at one of their two second electrodes with a common first bit line and at the other with a common second bit line, the first bit lines and the second bit lines arranged alternately;
a readout circuit for selecting a pair of the first and second bit lines both connected to the memory cell to be read, applying a predetermined voltage to between the first selected bit line and the second selected bit line, and sensing a memory cell current flowing through the memory cell to be read in order to conduct a readout action; and
a counter potential generation circuit for, during the readout action, generating from an intermediate node potential, which is higher than any voltage level of the potential on the first and second selected bit lines and supplied from an intermediate node on a current path for feeding the memory cell current in the readout circuit, a counter potential which varies in the same direction as that of the intermediate node potential depending on the memory cell current so that its variation is greater than that of the intermediate node potential, wherein
the counter potential is applied, during the readout action, to one of the first unselected bit lines other than the first selected bit line and second unselected bit lines other than the second selected bit line, which is allocated next to one at a higher voltage level of the first and second selected bit lines or is separated from one at a higher voltage level of the first and second selected bit lines by the or both the bit lines, at least another one of the first unselected bit lines and the second unselected bit lines which is held at the floating state.

2. The semiconductor memory device according to claim 1, wherein
the counter potential is generated so that its voltage level is higher than the minimum voltage level on one at a higher voltage level of the first and second selected bit lines when the intermediate node potential is at a higher voltage level or its voltage level is nearly equal to or lower than the minimum voltage level on the selected bit line at the higher voltage level when the intermediate node potential is at a lower voltage level.

3. The semiconductor memory device according to claim 1, wherein
the counter potential is set to a voltage level higher than the intermediate node potential when the intermediate node potential is at a higher voltage level or to a voltage level lower than the intermediate node potential when the intermediate node potential is at a lower voltage level.

4. The semiconductor memory device according to claim 1, wherein
during the readout action, the first and second bit lines connected to memory cells not to be read and not supplied with the counter potential are held at the floating state.

5. The semiconductor memory device according to claim 1, wherein
before the readout circuit senses the memory cell current, a predetermined precharge potential is applied to one of the first and second unselected bit lines which are connected to the memory cell not to be read, while the other of the two unselected bit lines is supplied with the counter potential.

6. The semiconductor memory device according to claim 5, wherein
the unselected bit line supplied with a precharge potential is set to the floating state immediately before or after the readout circuit senses the memory cell current.

7. The semiconductor memory device according to claim 5, wherein the precharge potential is lower than the counter potential.

8. The semiconductor memory device according to claim 1, wherein
before the readout circuit senses the memory cell current, a predetermined precharge potential is applied to the first unselected bit line or the second unselected bit line or both the unselected bit lines allocated between the two selected bit lines and the second bit line or the first bit line to which the counter potential is applied, and
during the readout action, the counter potential is applied to one of the first unselected bit line and the second bit line which is separated from one at a higher voltage level of the first and second selected bit lines by at least another one of the first unselected bit line and the second unselected bit line which is held at the floating state.

9. The semiconductor memory device according to claim 8, wherein
the unselected bit line supplied with a precharge potential is set the floating state immediately before or after the readout circuit senses the memory cell current.

10. The semiconductor memory device according to claim 8, wherein the precharge potential is lower than the counter potential.

11. The semiconductor memory device according to claim 1, wherein the counter potential generation circuit is implemented by a single-stage amplifying circuit.

12. The semiconductor memory device according to claim 11, wherein
the single-stage amplifying circuit includes a MOSFET connected in a cascade form and set with a predetermined bias potential at its gate.

13. The semiconductor memory device according to claim 1, wherein
the readout circuit is connected in a cascade form to the upstream side of the intermediate node on the current path and includes a MOSFET of which a gate potential is controllably determined by the intermediate node potential.

14. The semiconductor memory device according to claim 1, wherein
each memory cell is a nonvolatile memory cell with a MOSFET structure for changing a storage status of the memory cell, in which the first electrode serves as a control gate of the MOSFET and the paired second electrodes serve respectively as a drain and a source of the MOSFET.

* * * * *